(12) United States Patent
Gong et al.

(10) Patent No.: US 8,917,484 B2
(45) Date of Patent: Dec. 23, 2014

(54) MAGNETORESISTIVE ELEMENT WITH NANO-CRYSTALLINE SHIELD

(71) Applicant: Seagate Technology LLC, Cupertino, CA (US)

(72) Inventors: Jie Gong, Eden Prairie, MN (US); Ibro Tabakovic, Edina, MN (US); Steve Riemer, Minneapolis, MN (US); Michael Christopher Kautzky, Eagan, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 13/797,208

(22) Filed: Mar. 12, 2013

(65) Prior Publication Data
US 2014/0269235 A1   Sep. 18, 2014

(51) Int. Cl.
| | | |
|---|---|---|
| G11B 5/39 | (2006.01) | |
| G11B 5/127 | (2006.01) | |
| G11B 11/00 | (2006.01) | |
| G11B 5/11 | (2006.01) | |

(52) U.S. Cl.
CPC .................................. G11B 5/112 (2013.01)
USPC .................. 360/319; 360/324.12; 360/125.31

(58) Field of Classification Search
USPC ............ 360/319, 317, 324.1, 324.11, 324.12, 360/324.2, 125.31
See application file for complete search history.

(56) References Cited

U.S. PATENT DOCUMENTS

| | | | | |
|---|---|---|---|---|
| 5,932,343 | A  * | 8/1999 | Hayashi et al. | 428/332 |
| 6,150,046 | A  * | 11/2000 | Watanabe et al. | 428/811.5 |
| 6,178,112 | B1 | 1/2001 | Bessho et al. | |
| 6,275,360 | B1 * | 8/2001 | Nakamoto et al. | 360/319 |
| 6,376,108 | B1 * | 4/2002 | Otagiri et al. | 428/212 |
| 6,562,487 | B1 | 5/2003 | Vas'ko et al. | |
| 6,667,117 | B2 | 12/2003 | Uwazumi et al. | |
| 6,764,721 | B2 | 7/2004 | Uwazumi et al. | |
| 6,807,032 | B1 * | 10/2004 | Seigler et al. | 360/319 |
| 7,280,326 | B2 * | 10/2007 | Gill | 360/324.12 |
| 7,688,545 | B1 | 3/2010 | Vas'ko et al. | |
| 8,000,063 | B2 | 8/2011 | Yamaguchi et al. | |
| 2003/0002212 | A1 * | 1/2003 | Chen et al. | 360/126 |
| 2005/0007694 | A1 * | 1/2005 | Takahashi | 360/112 |
| 2007/0091513 | A1 * | 4/2007 | Sbiaa et al. | 360/324.11 |
| 2012/0267234 | A1 | 10/2012 | Reece et al. | |

* cited by examiner

*Primary Examiner* — Jefferson Evans
(74) *Attorney, Agent, or Firm* — Hall Estill Attorneys at Law

(57) ABSTRACT

A magnetoresistive data writer and reader may be generally configured at least with a magnetoresistive (MR) element contacting a magnetic shield that is constructed of $(Ni_{78}Fe_{22})_{99.8}O_{0.2}$ material. The magnetic shield may be formed with an electrodeposition process that uses β-diketones derivatives to form nano-crystalline grain structure after a subsequent annealing at temperatures above 400° C.

20 Claims, 4 Drawing Sheets

US 8,917,484 B2

MAGNETORESISTIVE ELEMENT WITH NANO-CRYSTALLINE SHIELD

SUMMARY

Various embodiments are generally directed to a data element capable of being used in high data bit density data storage environments.

In accordance with various embodiments, a magnetoresistive data writer and reader may be configured with a magnetoresistive (MR) element contacting a magnetic shield that is contructed of $(Ni_{78}Fe_{22})_{99.8}O_{0.2}$ material.

DETAILED DESCRIPTION

An increased industry demand for higher data capacity has stressed the minimization of data accessing components, such as magnetic shields. The construction of microscopic magnetic layers has allowed data storage technology to advance to decreased form factors and increased data access speeds for rotating media data storage devices. However, reduction of magnetic layer thickness combined with high temperature annealing conditions can produce thermally unstable films due at least in part to grain sizes that are an increased proportion of the layer's overall thickness. Such thermal instability can degrade magnetic performance of not only the shield layer itself, but also the magnetoresistive lamination deposited thereupon.

Commonly, a Permalloy ($Ni_{80}Fe_{20}$) material is formed as a magnetic shield. The relatively large grain growth associated with construction of thin film Permalloy can cause deterioration in magnetic properties like anisotropy and coercivity as annealing temperatures increase above roughly 300° C. and produce disordered magnetic domains in the thin film. The coarsening of grains in the thin film can further roughen the exterior surface of the material, which may correspond with interrupted lamination interfaces and orange-peel coupling that increases signal-to-noise ratio and degrades magnetoresistive effect between contacting data access layers. Hence, a soft magnetic shield thin film that has minimal grain size despite high temperature annealing is in increased industry demand.

Accordingly, a magnetoresistive element, such as a data writer and reader, can contact a magnetic shield constructed of $(Ni_{28}Fe_{22})_{99.8}O_{0.2}$ material. Such material can be electrodeposited with optimized thickness and magnetic properties like soft magnetic coercivity and low magnetostriction that can be sustained after annealing operations above 300° C. The ability to form less than 12 nm grains in the $(Ni_{28}Fe_{22})_{99.8}O_{0.2}$ material can provide thermal stability and retention of optimized magnetic properties through a variety of annealing conditions corresponding to a diverse group of data storage environments.

Figure 1:
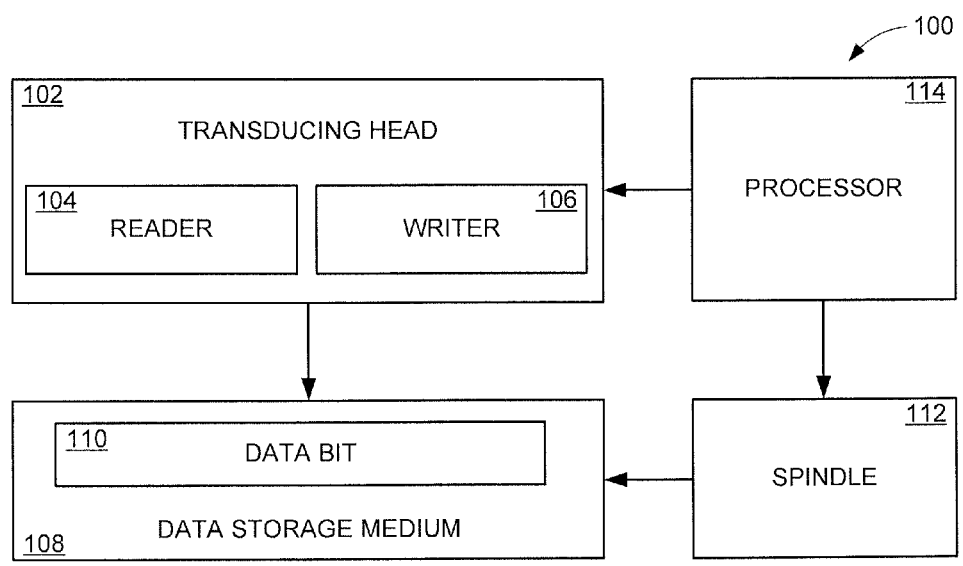
FIG. 1 provides a block representation of an example data storage device configured in accordance with various embodiments.

While the $(Ni_{28}Fe_{22})_{99.8}O_{0.2}$ magnetic material may be practiced in an unlimited variety of environments, FIG. 1 generally illustrates a block representation of an example data storage device 100 that can utilize $(Ni_{28}Fe_{22})_{99.8}O_{0.2}$ as a magnetic shield in accordance with various embodiments. The data storage device 100 is shown in a non-limiting configuration where a transducing head 102 has a data reader 104 and data writer 106 that can be positioned over a variety of locations on a magnetic storage medium 108, such as over stored data bits 110. The storage medium 108 can be attached to one or more spindle motors 112 that rotate during use to produce an air bearing surface (ABS) on which the transducing head 104 flies to access predetermined portion of the medium 108. In this way, one or more local or remote processors 114 can provide controlled motion of the spindle 112 to align the reader 104 and writer 106 with selected data bits 110. However, the consolidation of data bits 110 to provide greater data capacity has emphasized the physical size of the transducing head 102.

Figure 2:
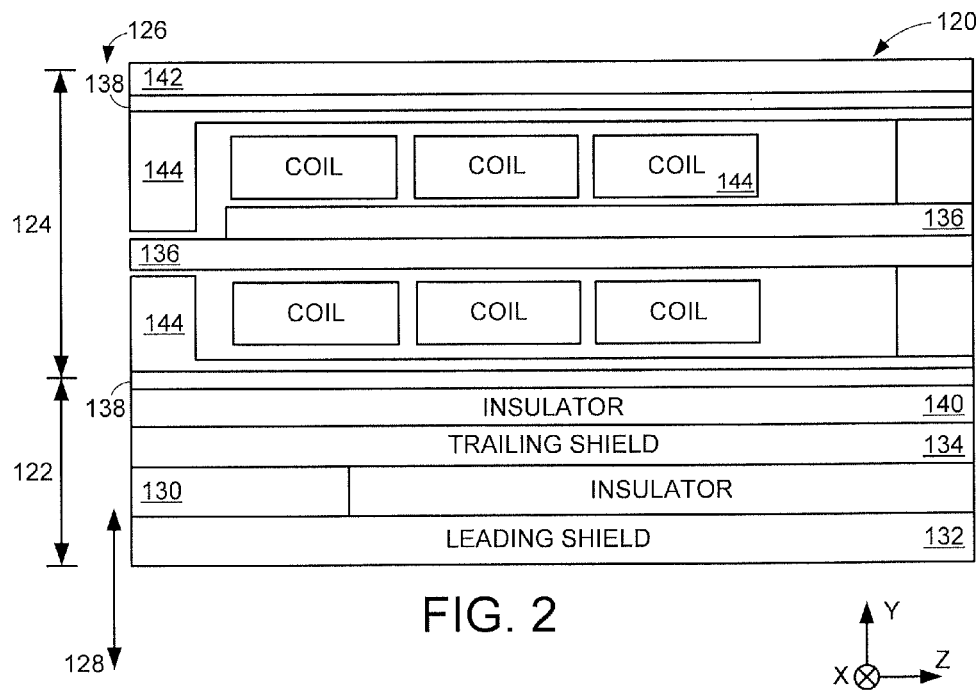
FIG. 2 illustrates a cross-sectional block representation of an example magnetic element capable of being used in the data storage device of FIG. 1.

FIG. 2 displays a cross-sectional block representation of an example magnetic element 120 capable of being implemented into the transducing head 102 of FIG. 1 to provide data reading and writing capabilities. As shown, the magnetic element 120 can comprise have one or more data access elements, such as the magnetic reader 122 and writer 124, which can operate individually or concurrently to write data to or retrieve data from an adjacent storage media, such as medium 108 of FIG. 1. Each magnetic element 122 and 124 is constructed of a variety of shields surrounding a transducing element on an air bearing surface 126 to read data from and write data to a corresponding data medium along a data track 128.

The magnetic reading element 122 has a magnetoresistive (MR) element 130 disposed between leading and trailing shields 132 and 134. Meanwhile, the writing element 124 has a write pole 136 disposed between return poles 138 that operate to produce a writing circuit that imparts a predetermined magnetic orientation to the adjacent storage medium. In the non-limiting configuration of the write element 124 shown in FIG. 2, two return poles 138 are respectively contact a non-magnetic insulator layer 140 and trailing shield 142, which each act to prevent magnetic flux passing through the poles 136 and 138 from extending beyond the bounds of the writing element 124. Each return pole 138 further contacts insulating material 144 that maintains magnetic separation of the writing poles 136 and 138 while defining a predetermined magnetic extent of the write pole 136.

The shields 132, 134, 140, and 142 of the magnetic element 120 can be characterized by their position with respect to the timing of encountering external bits, such as data bits 110 of FIG. 1. In other words, the shields that encounter the external bits before the transducing elements 122 and 124 are "leading" shields while shields that see the bits after the transducing elements are "trailing" shields. Such characterization extends to the difference between "uptrack" or "downtrack" of the transducing elements in that, depending on the direction of travel for the magnetic element 120 along the data track 128, the shields can be either leading or trailing and either uptrack or downtrack.

Figure 3A:
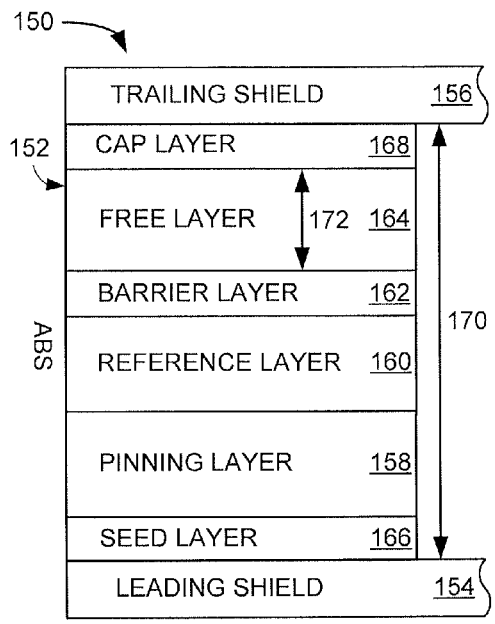
FIGS. 3A and 3B respectively show cross-sectional block representations of example magnetic elements constructed in accordance with some embodiments.
Figure 3B:
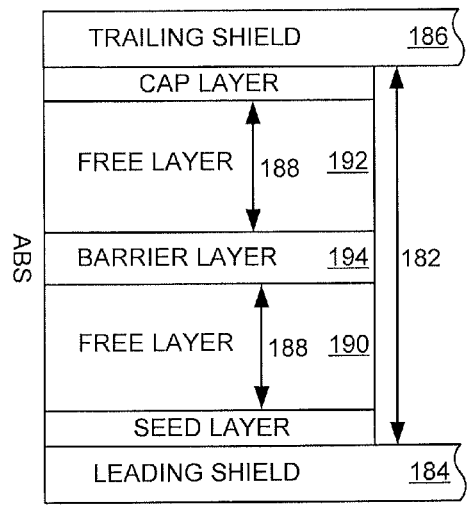

While the magnetic element 120 has a plurality of shielding layers positioned along the Y axis that dispel magnetic flux from reaching uptrack and downtrack data bits, increased data bit densities have led to the tighter data tracks 128 that may correspond with additional shielding along the Z axis. The proliferation of higher data bit density has caused transducing elements 122 and 124 to decrease in size on the ABS 126 to provide enough resolution to sense individual data bits without inadvertently reading or writing adjacent data bits and tracks 128. FIGS. 3A and 3B respectively show magnetic stacks 150 and 180 that each illustrate how a magnetic reader can be reduced in size in accordance with some embodiments.

As shown in FIG. 3A, an abutted junction magnetic stack 150 is constructed with a lamination 152 disposed between leading 154 and trailing 156 shields. The lamination 152 has a fixed magnetization pinning layer 158 contacting a fixed magnetization reference layer 160 opposite a non-magnetic barrier layer 162 from a magnetically free layer 164. The non-magnetic barrier layer 162 may, alternatively, be constructed as spacer layer of non-magnetic material, such as Cu or Ag. As the free layer 164 responds to an external data bit while the reference layer 160 maintains a fixed magnetization due to the exchange coupling with the pinning layer 158, an external data bit can be read as a logical state. Through various tuned configurations, seed 166 and cap 168 layers can be positioned on a single, or opposite sides of the lamination 152 to provide predetermined grain growth and magnetic properties, such as anisotropy, in the pinning layer 158.

Construction of the abutted junction magnetic stack 150 can have a shield-to-shield spacing 170 and free layer thickness 172 that determines the magnetic extent of the stack 150 and the possible data track resolution. However, the inclusion of the reference 160 and pinning 158 layers can correspond to a smaller free layer thickness 172, increased shield-to-shield spacing 170, and reduced magnetoresistive ratio between the free 164 and reference 160 layers. In contrast, the trilayer stack 180 of FIG. 3B may be used to read data bits with a reduced distance 182 between the leading 184 and trailing 186 shields and greater free layer thickness 188 compared to the abutted junction stack 150.

In operation, the trilayer stack 180 has first 190 and second 192 magnetically free layers that are separated by a barrier layer 194 and set to default magnetizations by biasing structures external to the trilayer stack 180. The relocation of any fixed magnetization structures from the stack 180 to elsewhere allow for the reduced shield-to-shield spacing 182 compared to the fixed magnetization having abutted junction stack 150. However, the lack of any fixed magnetization in the trilayer stack 180 can be difficult to bias properly to read data at an elevated speed. Thusly, refinement of the abutted junction stack 150 to reduce shield-to-shield spacing 170 has been a recent focus.

While the shield-to-shield spacing 170 and 182 of the magnetic stacks 150 and 180 can play a role in the operational capabilities of increased data bit density data environments, reduction in the thicknesses of the respective shields has become a hurdle for minimized stack dimensions with reliable magnetic operation. That is, a variety of magnetic stack configurations can reduce the physical size of the magnetically operating layers, but the use of shield materials with large grains can jeopardize the structure and magnetic operation of a stack. Such condition is magnified when high annealing temperatures and durations are used to construct the magnetic characteristics of a magnetic stack. For example, a reduced shield-to-shield spacing 182 trilayer stack 180 may have predetermined magnetic coercivity and magnetostriction in the shields 184 and 186 until an annealing operation sets the magnetic characteristics of the stack and inadvertently causes grain growth that corresponds with deteriorated coercivity and magnetostriction in the shields.

Figure 4A:
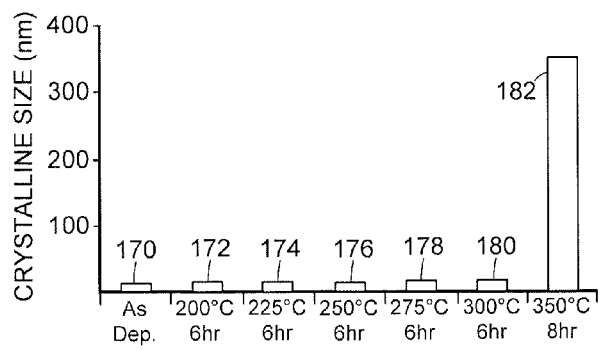
FIGS. 4A and 4B respectively plot structural and operational data from example magnetic elements constructed in accordance with various embodiments.
Figure 4B:
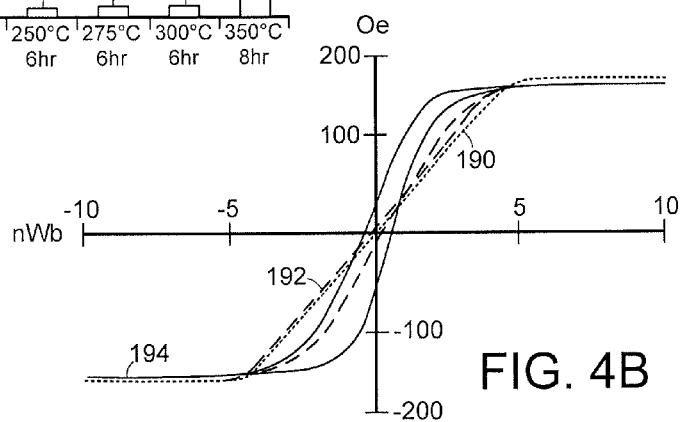

FIGS. 4A and 4B plot structural and operational data from an example data transducing element constructed with plated NiFe magnetic shields. FIG. 4A provides a histograph of crystalline grain size growth under a variety of anneal temperatures and durations. Bar 170 corresponds with the grain size of a magnetic shield layer as deposited and before any elevated temperature annealing operations. Bars 172, 174, 176, 178, and 180 illustrate that the grain size of the NiFe material does not drastically change for annealing temperatures at or below 300° C. However, the use of 300° C.+ annealing temperatures are becoming more prevalent and the structural configuration of the NiFe material is detrimentally affected, as shown by the over seven times greater than the 350° C. annealed grain size of bar 182 compared to bar 180.

The increase in grain size illustrated in FIG. 4A can be paired with deteriorated operational magnetic characteristics. FIG. 4B displays hysteresis loops for a variety of annealing temperature operations along the hard magnetic axis of an NiFe shield layer. Loop 190 and 192 has good symmetry and repeatable characteristics that are contrasted by loop 194 that is associated with 360° C. annealing. It can be appreciated that loop 194 has variations and asymmetry that jeopardize the magnetic shielding capability and consequently the magnetic operation of a data transducing element. As such, a magnetic shielding material like $(Ni_{28}Fe_{22})_{99.8}O_{0.2}$ that maintains minimal grain size for 350° C.+ annealing can provide more reliable shielding and magnetic structure in reduced form factor data storage environments.

Figure 5A:
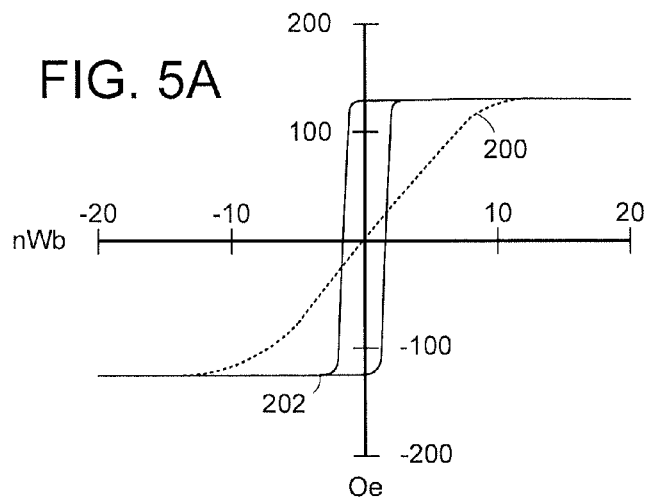
FIGS. 5A and 5B respectively graph structural and operational data from example magnetic elements constructed in accordance with some embodiments.
Figure 5B:
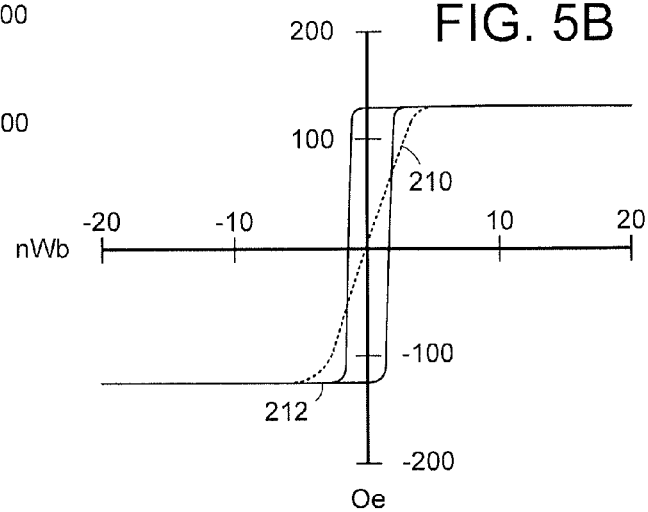

FIGS. 5A and 5B show magnetic hysteresis loops for an electrodeposited $(Ni_{28}Fe_{22})_{99.8}O_{0.2}$ magnetic shield constructed in accordance with various embodiments. FIG. 5A shows hard 200 and easy 202 axis magnetic loops for $(Ni_{28}Fe_{22})_{99.8}O_{0.2}$ material as deposited and before annealing operations. Loops 200 and 202 compare favorably to loops 210 and 212 that correspond to 450° C., 2 hour duration shield annealing followed by 325° C., four hour duration magnetic stack annealing. The contraction of the hard 210 and easy 212 loops while maintaining similar symmetry and shape illustrates how use of $(Ni_{28}Fe_{22})_{99.8}O_{0.2}$ material can provide optimized magnetic shielding and operational performance.

Figure 6:
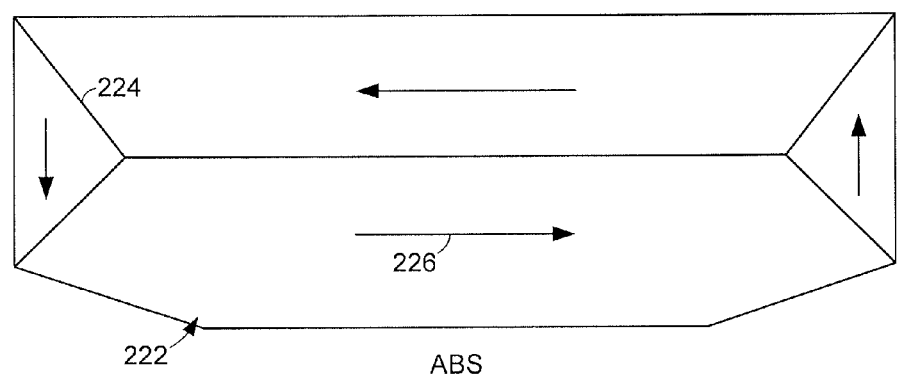
FIG. 6 illustrates a top view block representation of a portion of an example magnetic element constructed in accordance with various embodiments.
Figure 6:
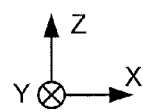

FIG. 6 elaborates on the magnetic performance shown in FIG. 5B by displaying a top view block representation of an example magnetic $(Ni_{28}Fe_{22})_{99.8}O_{0.2}$ shield 220 constructed in accordance with some embodiments. As the result of 400° C.+ annealing of the $(Ni_{28}Fe_{22})_{99.8}O_{0.2}$ material, the shield 220 is set with magnetic domains 222 defined by domain boundaries 224 and respectively containing magnetizations 226 of predetermined strength and orientation to establish a stable loop. Having the shield 220 constructed with 350° C.+ annealing temperatures allows the magnetic domains 222 to be stabilized despite thin dimensions at the ABS along the Y axis and magnetic saturation by a plurality of different magnetic flux from high data bit density environments. Thus, the combination of high temperature annealing and small grain size magnetic material post-anneal allows a data transducing element to have reduced dimensions and increased magnetic domain stability that can be used in a variety of sophisticated data storage devices.

Figure 7:
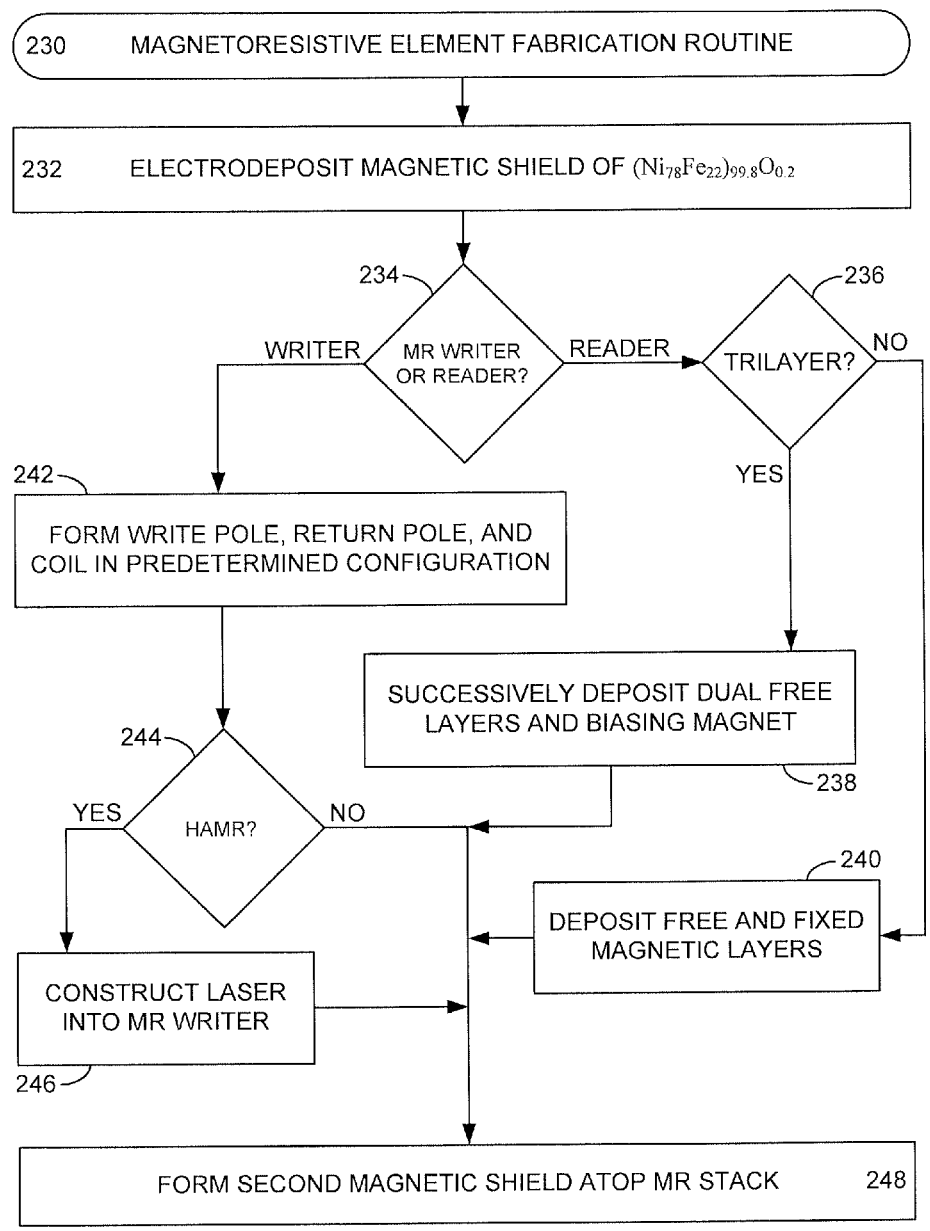
FIG. 7 maps an example magnetoresistive element fabrication routine conducted in accordance with some embodiments.

FIG. 7 provides an example magnetoresistive element fabrication routine 230 conducted in accordance with various embodiments to provide tuned magnetic shielding. Initially, routine 230 electrodeposits $(Ni_{28}Fe_{22})_{99.8}O_{0.2}$ material of a predetermined thickness in step 332. While not limiting, the electrodeposition of step 232 can take place in a bath having a predetermined chemistry, such as the constituent parts of table 1:

TABLE 1

| Chemical | Units | Concentration |
|---|---|---|
| $NH_4Cl$ | M | 0.2-0.4 |
| $H_3BO_3$ | M | 0.2-0.6 |
| $Ni^{2+}$ Salt | M | 0.03-0.06 |
| $Fe^{2+}$ Salt | mM | 4-8 |
| NSA-1 Additive | g/l | 0-1 |
| SLS ($C_{12}H_{25}SO_4Na$) | g/l | 0-0.1 |
| pH | | 2-4 |
| Current Density | $mA/cm^2$ | 5-50 | where NSA-1 Additives are β-diketones derivatives, such as 1,3-Inandione, 2-Aryliden 1,3-Inandione (A=phenyl, 2-pyridyl, 3-pyridyl, 4-pyridyl, 2-furyl), acetylacetone, and 3-methyl acetylacetone. Such β-diketones derivatives can provide smaller grain growth to provide an 8-12 nm grain size post-anneal. With the increase of pH in the electrodeposition solution, the oxygen and iron content in an $(Ni_{28}Fe_{22})_{99.8}O_{0.2}$ film increases while an increase in current density leads to iron and oxygen content decreasing in the film. The addition of $Co^{2+}$ salt into the predetermined chemistry of Table 1 can provide a thermally stable CoNiFeO alloy film with magnetic moments ranging from 1.4-20 T that can be used to lower data transducing element shielding to optimize magnetic performance.

The magnetic shield formed in step 232 can further have a predetermined exterior surface texture that allows subsequent magnetoresistive layers to be deposited with stable magnetic characteristics like anisotropy, coercivity, and magnetic moment. Such predetermined exterior surface can be used as a substrate to from a magnetoresistive (MR) reader and writer. Decision 234 determines which MR element is to be deposited on the magnetic shield of step 232. A decision to construct a MR reader proceeds to decision 236 where the type of reader is evaluated and chosen, such as an abutted junction or trilayer magnetic stack.

If a trilayer magnetic reader stack is chosen in decision 236, step 238 then successively deposits dual free layers separated by a non-magnetic spacer layer and biased to a predetermined default magnetization by a separate biasing magnet, as illustrated in FIG. 3B. A determination that a trilayer is not be constructed from decision 236 advances routine 230 to step 240 where an abutted junction is formed with both free and fixed magnetic layers separated by a non-magnetic spacer, as displayed in FIG. 3A.

In the event an MR writer is to be constructed from decision 234, at least a write pole, return pole, and coil are formed in a predetermined configuration conducive to programming data bits across an air bearing to a rotating data media. The formation of the data writer in step 242 can further include components to provide heat in assistance to data programming in what can be characterized as heat assisted magnetic recording (HAMR). Decision 244 evaluates if HAMR components are to be included into the MR writer formed in step 242. The decision to include HAMR capabilities to the MR writer proceeds to step 246 where at least a laser with predetermined optics, focal length, and control circuitry are constructed into the MR writer to heat portions of the rotating data media immediately prior to the write pole imparting a magnetization to the media.

After the HAMR components are constructed into the MR writer, or at the conclusion of the formation of the MR reader, or if no HAMR operation is to be provided by the MR writer, step 248 forms a second magnetic shield atop the MR reader or writer stack. In some embodiments, the second magnetic shield is electrodeposited as $(Ni_{28}Fe_{22})_{99.8}O_{0.2}$ while other embodiments form the second magnetic shield as a dissimilar material like an CoNiFeO alloy. Such diverse shield capabilities can provide varying shield thicknesses and magnetic shielding profiles for the MR element.

While a variety of different MR elements can be constructed through routine 230 that utilize a $(Ni_{28}Fe_{22})_{99.8}O_{0.2}$ magnetic shield, the various steps and decisions of routine 230 are not required or limited as the various decisions and steps can be omitted, changed, and added at will. As a non-limiting example, decision 234 can be revisited after step 248 to provide a MR element with both an MR reader and writer, similar to the magnetic element 120 of FIG. 2.

The ability to provide a magnetic shield material with nano-crystalline grain size despite annealing conditions above 350° C. allows for the formation of stable magnetic domains and smooth exterior surfaces conducive to reduced form factor magnetoresistive data transducing elements. The inclusion of a small percentage of oxygen into the magnetic shield operates to stabilize the material properties of the film without elevating magnetostriction, diluting magnetic moment, and increasing magnetic coercivity. The nano-uniformity provided by 450° C. annealing of $(Ni_{28}Fe_{22})_{99.8}O_{0.2}$ allows ultrafine ferromagnetic grains to be coupled to provide predetermined in-plane anisotropy that provides optimized magnetic shielding despite reduced thickness at the ABS.

It will be appreciated that the claimed technology can readily be utilized in any number of data storage applications, including non-rotating solid-state data storage environments. It is to be understood that even though numerous characteristics and configurations of various embodiments of the present disclosure have been set forth in the foregoing description, together with details of the structure and function of various embodiments, this detailed description is illustrative only, and changes may be made in detail, especially in matters of structure and arrangements of parts within the principles of the present disclosure to the full extent indicated by the broad general meaning of the terms in which the appended claims are expressed.

What is claimed is:

1. An apparatus comprising a magnetoresistive (MR) element contacting a magnetic shield comprising $(Ni_{78}Fe_{22})_{99.8}O_{0.2}$ with a grain size of 12nm or less.

2. The apparatus of claim 1, wherein the MR element comprises a trilayer magnetic stack having dual magnetically free layers without a fixed magnetization.

3. The apparatus of claim 1, wherein the MR element comprises an abutted junction magnetic stack having fixed and free magnetization layers.

4. The apparatus of claim 1, wherein the magnetic shield has a grain size of approximately 8-12nm.

5. The apparatus of claim 1, wherein the MR element comprises a data writer having write and return poles.

6. The apparatus of claim 5, wherein the data writer comprises a laser for heat assisted magnetic recording (HAMR).

7. A method comprising:
  electrodepositing a magnetic shield of $(Ni_{78}Fe_{22})_{99.8}O_{0.2}$; and
  contacting a magnetoresistive (MR) element with the magnetic shield on an air bearing surface (ABS).

8. The method of claim 7, wherein the magnetic shield is electrodeposited in a bath of a plurality of chemicals.

9. The method of claim 8, wherein the bath comprises at least one β-diketones derivative.

10. The method of claim 9, wherein a β-diketones derivative comprises 1,3-Indandione.

11. The method of claim 9, wherein a β-diketones derivative comprises 2-Aryliden.

12. The method of claim 9, wherein a β-diketones derivative comprises acetylacetone.

13. The method of claim 9, wherein a β-diketones derivative comprises 3-methyl acetylacetone.

14. The method of claim 9, wherein multiple β-diketones derivatives are used during electrodeposition.

15. The method of claim 8, wherein the bath comprises multiple different salts, $C_{12}H_{25}SO_4Na$, $NH_4Cl$, and $H_3BO_3$.

16. A method comprising:
    forming a magnetic shield of $(Ni_{78}Fe_{22})_{99.8}O_{0.2}$;
    annealing the magnetic shield to a temperature above 400° C.; and
    contacting a magnetoresistive (MR) element with the magnetic shield on an air bearing surface (ABS).

17. The method of claim 16, wherein the annealing step is conducted at approximately 450° C.

18. The method of claim 17, wherein the annealing step is conducted for approximately for approximately 2 hours or less along a magnetically easy axis of the magnetic shield.

19. The method of claim 17, wherein the annealing step further comprises annealing at approximately 325° C. for approximately 4 hours along a magnetically hard axis for the magnetic shield.

20. The method of claim 16, wherein the magnetic shield has multiple magnetizations oriented in a stable loop.

\* \* \* \* \*

UNITED STATES PATENT AND TRADEMARK OFFICE
CERTIFICATE OF CORRECTION

| | | |
|---|---|---|
| PATENT NO. | : 8,917,484 B2 | Page 1 of 1 |
| APPLICATION NO. | : 13/797208 | |
| DATED | : December 23, 2014 | |
| INVENTOR(S) | : Jie Gong et al. | |

It is certified that error appears in the above-identified patent and that said Letters Patent is hereby corrected as shown below:

In the Claims

In Col. 7, Line 24
delete second instance of "for approximately"

In Col. 7, Line 27
delete "."

Signed and Sealed this
Fourteenth Day of April, 2015

Michelle K. Lee
*Director of the United States Patent and Trademark Office*